United States Patent
Lou et al.

(10) Patent No.: US 11,047,880 B2
(45) Date of Patent: Jun. 29, 2021

(54) PROBING DEVICE

(71) Applicant: STAR TECHNOLOGIES, INC., Hsinchu (TW)

(72) Inventors: Choon Leong Lou, Hsinchu (TW); Ho Yeh Chen, Hsinchu (TW)

(73) Assignee: STAR TECHNOLOGIES, INC., Hsinchu (TW)

(*) Notice: Subject to any disclaimer, the term of this patent is extended or adjusted under 35 U.S.C. 154(b) by 85 days.

(21) Appl. No.: 16/513,401

(22) Filed: Jul. 16, 2019

(65) Prior Publication Data
US 2020/0225266 A1 Jul. 16, 2020

Related U.S. Application Data

(60) Provisional application No. 62/793,060, filed on Jan. 16, 2019.

(51) Int. Cl.
*G01R 31/00* (2006.01)
*G01R 1/073* (2006.01)
*G01R 31/28* (2006.01)

(52) U.S. Cl.
CPC ...... *G01R 1/07342* (2013.01); *G01R 31/2891* (2013.01)

(58) Field of Classification Search
CPC ............ G01R 1/073; G01R 1/07314; G01R 1/07342; G01R 1/07378; G01R 1/06711; G01R 1/06722; G01R 1/06738; G01R 31/28; G01R 31/2886; G01R 31/2889
See application file for complete search history.

(56) References Cited

U.S. PATENT DOCUMENTS

| 4,845,426 A | 7/1989 | Nolan et al. | |
|---|---|---|---|
| 5,378,971 A * | 1/1995 | Yamashita | C22C 5/02 324/72.5 |
| 5,910,727 A * | 6/1999 | Fujihara | G01R 31/2893 324/758.03 |
| 6,194,907 B1 * | 2/2001 | Kanao | G01R 31/2886 324/627 |

(Continued)

FOREIGN PATENT DOCUMENTS

| DE | 202013005907 U1 | 9/2013 |
|---|---|---|
| JP | 2002022770 A | 1/2002 |

(Continued)

OTHER PUBLICATIONS

Office action and Search report dated Aug. 20, 2020 from the TIPO counterpart application TW108145031.

(Continued)

*Primary Examiner* — Thang X Le
(74) *Attorney, Agent, or Firm* — WPAT, P.C., Intellectual Property Attorneys; Anthony King

(57) ABSTRACT

A probing device includes a chuck configured to support a device under test (DUT), and includes a probe card disposed above the chuck. The probe card includes an inlet configured to convey a gas into the probe card, and an outlet configured to blow the gas at a predetermined temperature from the probe card toward the chuck. A method includes providing a chuck, a DUT disposed on the chuck and a probe card disposed above the DUT, and blowing a gas at a predetermined temperature from the probe card toward the DUT.

19 Claims, 4 Drawing Sheets

(56) References Cited

U.S. PATENT DOCUMENTS

| | | | |
|---|---|---|---|
| 8,638,118 B2 * | 1/2014 | Nakata | G01R 31/2887 324/762.05 |
| 2002/0189648 A1 | 12/2002 | Engelking et al. | |
| 2006/0201232 A1 | 9/2006 | Itakura et al. | |
| 2007/0018676 A1 | 1/2007 | Rittberger et al. | |
| 2007/0169535 A1 * | 7/2007 | Itakura | G01N 27/223 73/1.06 |
| 2008/0048700 A1 | 2/2008 | Lou et al. | |
| 2009/0039908 A1 | 2/2009 | Ikeuchi et al. | |
| 2010/0182013 A1 | 7/2010 | Lou | |
| 2014/0184259 A1 | 7/2014 | Andoh et al. | |
| 2015/0015285 A1 | 1/2015 | Shinohara et al. | |
| 2015/0054535 A1 | 2/2015 | Yoshioka | |
| 2018/0284155 A1 | 10/2018 | Beng et al. | |
| 2020/0200798 A1 * | 6/2020 | Pareja | G01R 1/07342 |

FOREIGN PATENT DOCUMENTS

| | | |
|---|---|---|
| JP | 3366239 B2 | 1/2003 |
| KR | 1020070005786 A | 1/2007 |
| TW | 454290 | 9/2001 |
| TW | 567313 B | 12/2003 |
| TW | 200806967 A | 2/2008 |
| TW | 201638988 A | 11/2016 |

OTHER PUBLICATIONS

English abstract translation of TW567313B.
Search report dated Jun. 3, 2020 from the EPO counterpart application EP20150156.6.
English abstract translation of DE202013005907U1.
English abstract translation of JP2002022770A.
English abstract translation of KR1020070005786A.

* cited by examiner

PROBING DEVICE

PRIORITY CLAIM AND CROSS-REFERENCE

This application claims the priority benefit of U.S. provisional application Ser. No. 62/793,060 filed on Jan. 16, 2019. The entirety of the above-mentioned patent application is hereby incorporated by reference herein and made a part of this specification.

TECHNICAL FIELD

The present disclosure relates to a testing equipment, and particularly relates to a probing device for testing a semiconductor device. Further, the present disclosure relates to a method of operating the testing equipment, and particularly relates to a method of operating the probing device.

DISCUSSION OF THE BACKGROUND

After fabrication, a semiconductor device, such as a wafer, is tested by a probing device. However, during the fabrication, residues, contaminants or chippings may be undesirably produced and fallen on the semiconductor device. These unwanted material may adversely affect the testing of the semiconductor device.

Further, the semiconductor device may be required to be tested under a predetermined temperature. However, the testing of the semiconductor device may be performed immediately after the fabrication, and thus the semiconductor device may not be under the predetermined temperature upon the testing. Therefore, accuracy of the testing of the semiconductor device may be decreased.

Accordingly, there is a continuous need to improve a configuration of the probing device.

This Discussion of the Background section is provided for background information only. The statements in this Discussion of the Background are not an admission that the subject matter disclosed in this Discussion of the Background section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a probing device. The probing device includes a chuck configured to support a device under test, and a probe card disposed above the chuck. The probe card includes an inlet configured to convey a gas into the probe card, and an outlet configured to blow the gas at a predetermined temperature from the probe card toward the chuck.

In some embodiments, the probe card further includes a temperature-controlling device configured to adjust a temperature of the gas blown out from the outlet.

In some embodiments, the predetermined temperature is in a range between about −60° C. and about 300° C.

In some embodiments, a distance between the outlet and the DUT is substantially less than or equal to 10 mm.

In some embodiments, the gas is a clean dry air or a nitrogen gas.

In some embodiments, the outlet is oriented toward a center of the DUT.

In some embodiments, the outlet further includes a plurality of sub-outlets, wherein orientations of the sub-outlets are adjustable.

In some embodiments, the probing device further includes a controller electrically connected to the probe card. The controller is configured to determinate whether the temperature measured by the probe card conforms to the predetermined temperature.

In some embodiments, the probing device further includes a chamber, wherein the chuck, the DUT and the probe card are arranged in the chamber.

In some embodiments, the DUT is a semiconductor device.

In some embodiments, the DUT is a wafer.

Another aspect of the present disclosure provides a method. The method includes providing a chuck, a DUT disposed on the chuck, and a probe card disposed above the DUT. The method further includes blowing a gas at a predetermined temperature from the probe card toward the DUT.

In some embodiments, the method further includes adjusting a temperature of the gas at the probe card to the predetermined temperature.

In some embodiments, the method further includes conveying the gas into the probe card.

In some embodiments, the method further includes altering a temperature of at least a portion of the DUT during or after the blowing of the gas.

In some embodiments, unwanted material is removed from the DUT or from the probe card by the blowing of the gas.

In some embodiments, the predetermined temperature is in a range between about −60° C. and about 300° C.

In some embodiments, the predetermined temperature is room temperature.

In some embodiments, the gas is blown at a predetermined speed.

In some embodiments, the gas is blown toward the center of the DUT.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 1:
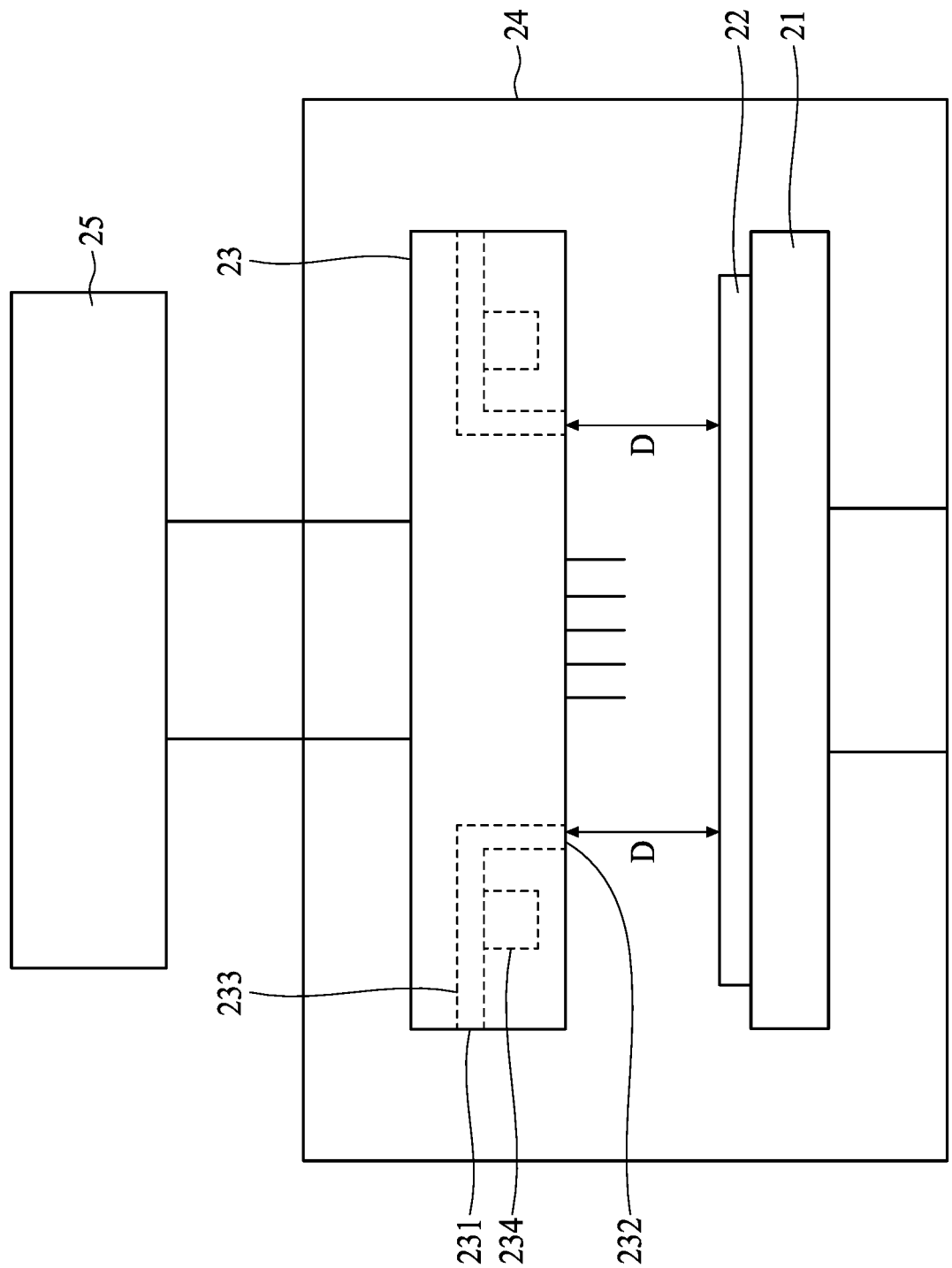
FIG. 1 is a schematic cross-sectional view of a probing device in accordance with some embodiments of the present disclosure.

The present disclosure provides a probing device capable of heating or cooling a DUT (such as a wafer) and removal of unwanted material from the DUT. FIG. 1 shows a probing device 200 according to aspects of the present disclosure in some embodiments. The probing device 200 includes a chuck 21 configured to support a DUT 22, and a probe card 23 disposed above the chuck 21. The probe card 23 includes an inlet 231 configured to convey a gas into the probe card 23, and an outlet 232 configured to blow the gas at a predetermined temperature from the probe card 23 toward the chuck 21. The gas blown at the predetermined temperature from the outlet 232 may modify the temperature of the DUT 22 in non-contact way, such as by convection. In detail, the gas is conveyed into the inlet 231 and blown from the outlet 232 toward the DUT 22 at the predetermined temperature, such that the temperature of at least a portion of the DUT 22 can be changed, and the unwanted material on the DUT 22 can be removed.

In some embodiments, the DUT 22 is a semiconductor device. In some embodiments, the DUT 22 is a wafer.

Wafer tests generally perform under a room temperature, a high temperature (e.g. higher than the room temperature) or a low temperature (e.g. lower than the room temperature). Heating or cooling of the DUT 22 may be required prior to the performance of the wafer tests. In some embodiments, the gas is blown from the outlet 232 toward the DUT 22 to increase a temperature of the DUT 22 (heating of the DUT 22). In some embodiments, the gas is blown from the outlet 232 toward the DUT 22 to decrease a temperature of the DUT 22 (cooling of the DUT 22). Generally, the closer the outlet 232 is to the DUT 22, the more efficiently the gas can heat or cool the DUT 22 and the temperature of at least a portion of the DUT 22 is increased or decreased.

In some embodiments, the probing device 200 further includes a chamber 24. The chuck 21, the DUT 22 and the probe card 23 are arranged in the chamber 24. It should be noted that a minimum distance from the outlet 232 to the DUT 22 is significantly smaller than a minimum distance from the peripheral wall of the chamber 24 to the DUT 22. That is, in changing the temperature of at least a portion of the DUT 22 to the predetermined temperature, the gas supplied from the outlet 232 of the probe card 22 is more effective than the gas supplied from the peripheral wall of the chamber 24. Further, the unwanted materials such as dust, contaminants and any by-products on the DUT 22 may be blown away from the DUT 22.

In some embodiments, there is a distance between the outlet 232 and the DUT 22. The distance D can be determined based on various factors, including, for example, number of outlets 232, the blowing speed of the gas, the size of the DUT 22, design rules for the DUT 22, and other factors, as one skilled in the art will understand. In some embodiments, the distance D between the outlet 232 and the DUT 22 is substantially less than or equal to 10 mm.

FIG. 1 illustrates only two outlets 232 and two inlets 231 disposed in the probe card 23 for clarity and simplicity; however, a person ordinarily skilled in the art would readily understand that one or more outlets 232 and inlets 231 can be present. In some embodiments, the probe card 23 includes a plurality of outlets 232. In some embodiments, the probe card 23 includes one inlet 231, and the gas enters the probe card 23 through the inlet 231 and is blown out from the outlets 232. In some embodiments, each inlet 231 is connected to a corresponding outlet 232.

In some embodiments, the outlet 232 is arranged in a manner that allows the temperature of the whole DUT 22 to be adjusted. In some embodiments, the outlet 232 is arranged in a manner that allows the temperature of only a specific portion of the DUT 22 to be adjusted. In some embodiments, the outlet 232 is directed toward a center of the DUT 22. In some embodiments, the outlet 232 is directed toward a periphery of the DUT 22. In some embodiments, each outlet 232 may be directed toward a different portion of the DUT 22.

Figure 2:
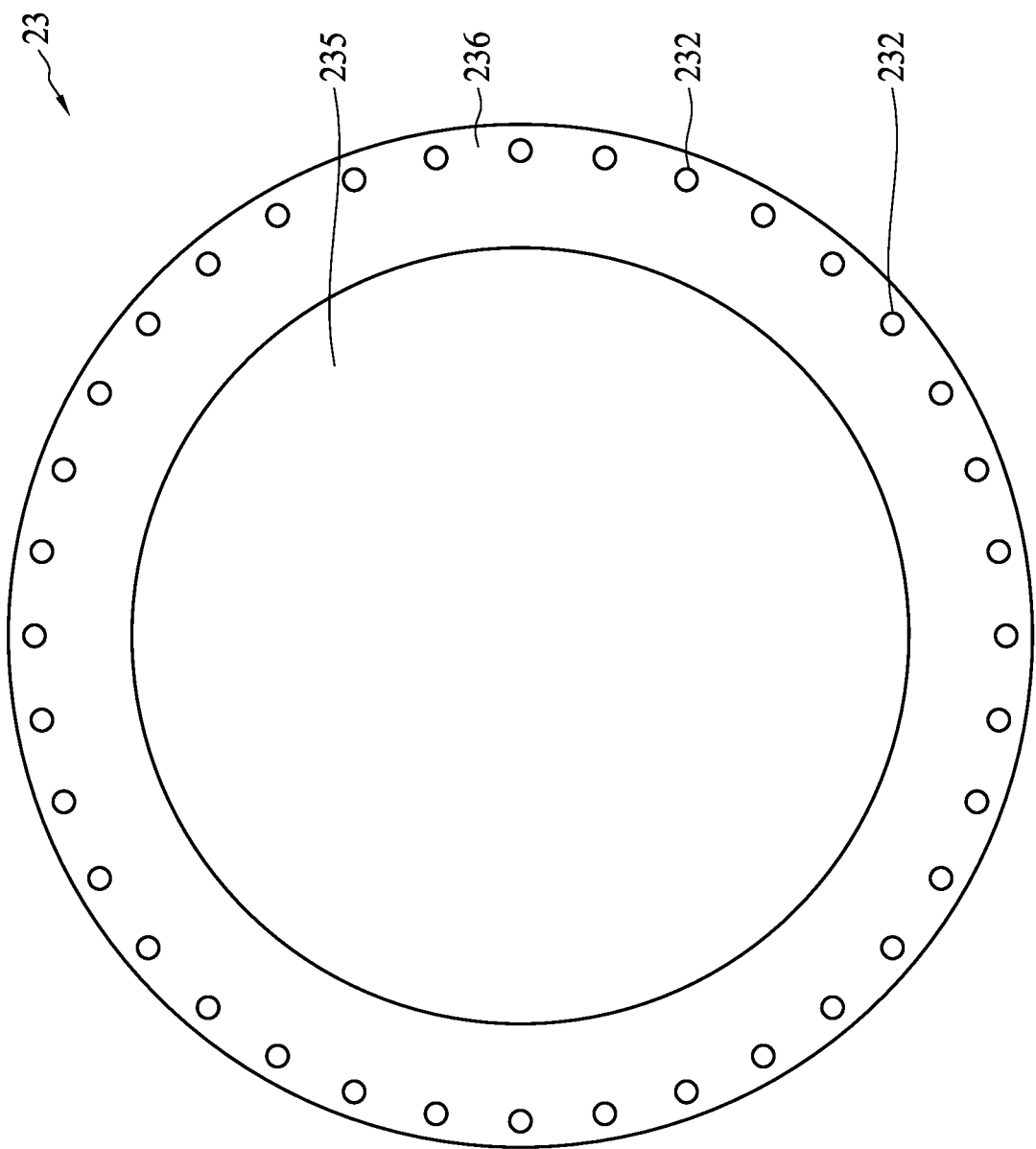
FIG. 2 is a schematic cross-sectional bottom view of a probe card in accordance with some embodiments of the present disclosure.

FIG. 2 is a bottom view of the probe card 23. The probe card 23 can be, but is not necessarily, round, oval, rectangular, square or another desired shape corresponding to the DUT 22. As shown in FIG. 2, in some embodiments, the bottom surface of the probe card 23 includes a central region 235 and a peripheral region 236. The central region 235 may have a round shape while the peripheral region 236 may have a ring shape encircling the central region 235. In some embodiments, the outlets 232 are disposed along the circumference of the probe card 23. In some embodiments, the outlets 232 are disposed in the central region 235 of the bottom surface of the probe card 23. In some embodiments, the outlets 232 are disposed in the peripheral region 236 of the bottom surface of the probe card 23. In some embodiments, the outlets 232 are in same configuration as each other. Each of the outlets 232 has a same shape and a same width, but the disclosure is not limited thereto. For example, all of the outlets 232 are in circular shape and have same diameter. In some embodiments, a distance between any two neighboring outlets 232 is consistent, but the disclosure is not limited thereto.

Referring back to FIG. 1, in some embodiments, the distance D between each outlet 232 and the DUT 22 can be the same or different depending on requirements.

In some embodiments, the probe card 23 further includes a pipe configured to connect the outlet 232 and the corresponding inlet 231. In some embodiments, the pipe 233 is disposed in the probe card 23. In some embodiments, arrangement of the pipe 233 matches the settings of the probe card 23.

In some embodiments, the probe card 23 further includes a temperature-controlling device 234 configured to adjust a temperature of the gas blown out from the outlet 232. In some embodiments, the temperature-controlling device 234 is integrated with the probe card 23, and may be positioned near the inlet 231, the outlet 232, and/or the pipe 233.

In some embodiments, the predetermined temperature is in a range between about −60° C. and about 300° C. For the ambient temperature test, in some embodiments, the predetermined temperature is in a range between about 15° C. and about 40° C.

In some embodiments, the gas is clean dry air, a nitrogen gas, argon or any other suitable gas. In some embodiments, the purity of the nitrogen gas is greater than 99%.

In some embodiments, the probe card 23 is further connected to a gas supply (not shown) through various apparatuses such as a gas tube, pressure regulators, valves, mass flow controllers, or other flow controllers, manifolds, and/or regulators. In some embodiments, the gas supply is integrated with the probe card 23.

In some embodiments, the probing device further includes a test module 25 connected to the probe card 23. The test module 25 is configured to process the signals detected by the probe card 23 and adjust the position of the probe card 23 and the position of the DUT 22.

Figure 3:
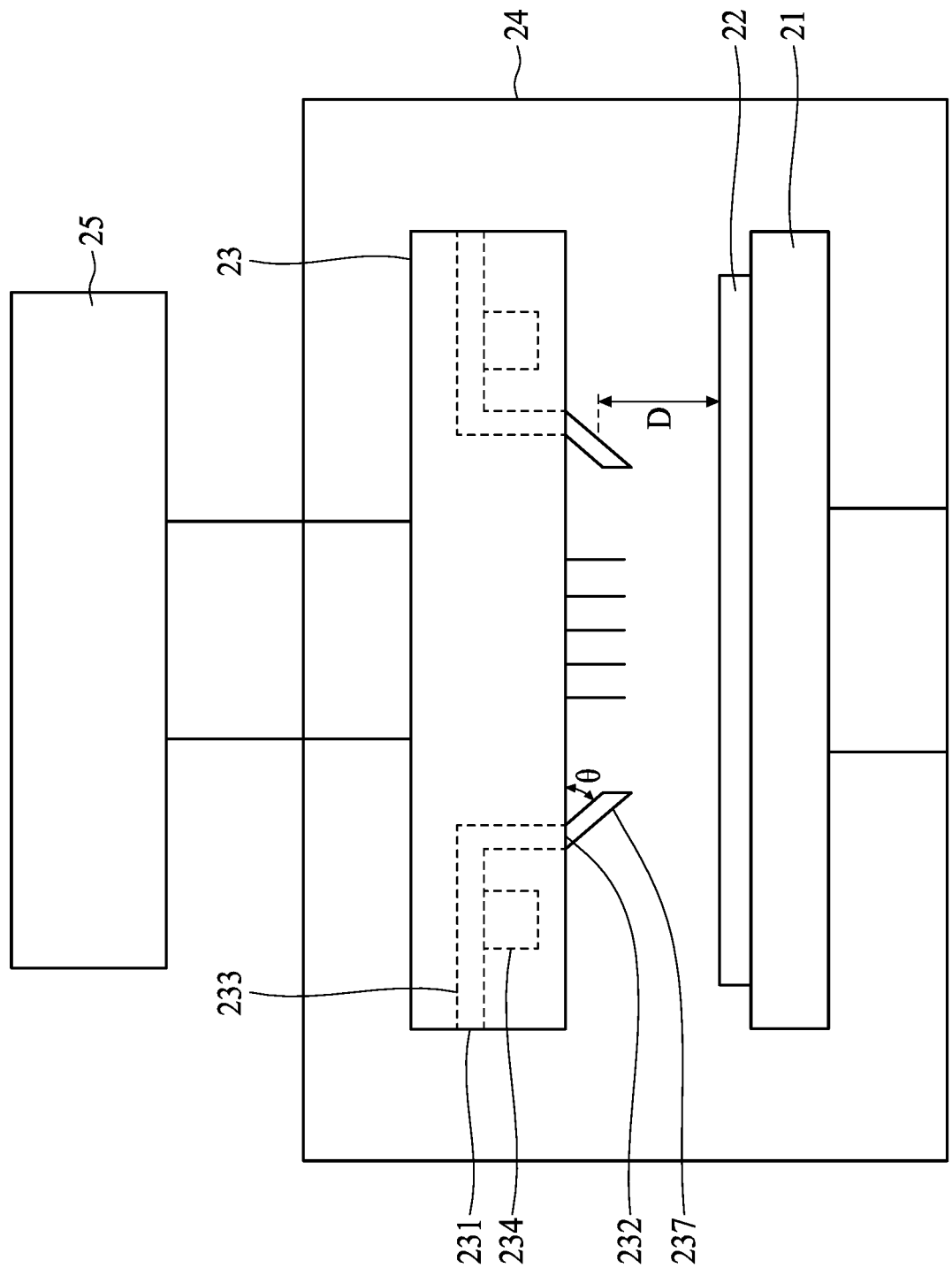
FIG. 3 is a schematic cross-sectional view of a probing device in accordance with some embodiments of the present disclosure.

FIG. 3 is a diagram schematically showing another probing device 300 according to aspects of the present disclosure in some embodiments. In some embodiments, the probing device 300 includes a chuck 21 configured to support a DUT 22, a chamber 24 and a test module 25, which are in configurations similar to those described above or shown in FIG. 2.

In some embodiments, the probe card 23 includes the inlet 231 and the outlet 232, wherein the outlet 232 further includes a plurality of sub-outlets 237. In some embodiments, orientations of the sub-outlets 237 are adjustable. In some embodiments, each of the sub-outlets 237 is oriented at an angle θ relative to the bottom surface of the probe card 23. As such, the gas blown from the sub-outlets 237 may substantially be directed toward a desired portion of the DUT 22, the temperature of at least a portion of the DUT 22 can be effectively adjusted, and the unwanted material on the DUT 22 can be completely removed. In some embodiments, the angle θ is in a range from 0° to 90°.

In the present disclosure, a method of operating a probing device is disclosed. In some embodiments, a DUT such as a semiconductor device is tested by the method. The method includes a number of operations and the description and illustrations are not deemed as a limitation of the sequence of the operations.

Figure 4:
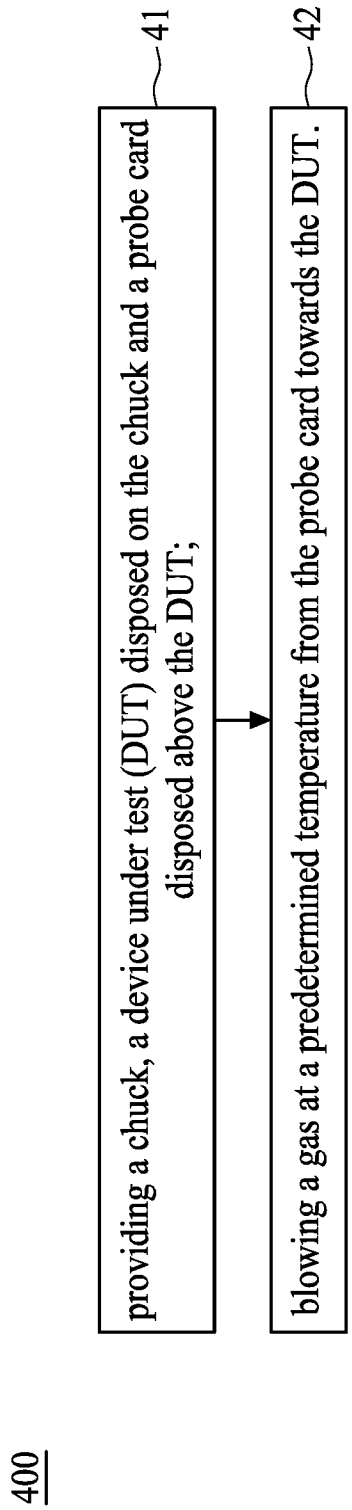
FIG. 4 is a flowchart representing a method of operating a probing device according to aspects of the present disclosure in one or more embodiments.

FIG. 4 is a flowchart depicting an embodiment of the method 400 of operating the probing device. The method includes operations 41 and 42. In some embodiments, the operations 41 and 42 are implemented to operate the probing device 200 or 300 described above or illustrated in FIGS. 1 to 3.

The method begins with operation 41, in which a chuck 21, a DUT 22 disposed on the chuck 21 and a probe card 23 disposed above the DUT 22 are provided. The probe card 23 includes an inlet 231 configured to convey a gas into the probe card 23, and an outlet 232 configured to blow the gas at a predetermined temperature from the probe card 23 toward the chuck 21. In some embodiments, the DUT 22 is a semiconductor device. In some embodiments, the DUT 22 is a wafer.

In operation 42, a gas is blown at a predetermined temperature from the probe card 23 toward the DUT 22. In some embodiments, the effect of the method is that, when the gas is blown, unwanted material on the DUT 22 may be removed, and a temperature of at least a portion of the DUT 22 may be altered. In some embodiments, the unwanted materials include dust, contaminants or any by-products on the DUT 22.

In some embodiments, the method further includes adjusting a temperature of the gas in the probe card 23 to the predetermined temperature. In some embodiments, the temperature of the gas is adjusted through a temperature control element 234.

In some embodiments, the method further includes altering a temperature of at least a portion of the DUT 22 when the gas is blown.

In some embodiments, the predetermined temperature is in a range between about −60° C. and about 300° C. In some embodiments, the predetermined temperature is room temperature. In some embodiments, the room temperature is in a range between about 15° C. and about 40° C.

In some embodiments, the method further includes conveying the gas into the probe card 23 while blowing the gas from the probe card 23.

In some embodiments, the gas is blown at a predetermined speed. The predetermined speed of the gas may effectively alter the temperature of at least a portion of the DUT 22 and may remove the unwanted material from the DUT 22.

In some embodiments, the gas is blown toward a desired portion of the DUT 22. In some embodiments, the gas is blown toward the center of the DUT.

Accordingly, the present disclosure therefore provides a probing device and a method of testing. The probing device includes a chuck configured to support a device under test, and also includes a probe card disposed above the chuck. The probe card includes an inlet configured to convey a gas into the probe card, and an outlet configured to blow the gas at a predetermined temperature from the probe card toward the chuck. Consequently, the gas blown from the outlet of the probe card may remove unwanted material from the DUT, and may effectively alter the temperature of at least a portion of the DUT.

Although the present disclosure and its advantages have been described in detail, it should be understood that various changes, substitutions and alterations can be made herein without departing from the spirit and scope of the disclosure as defined by the appended claims. For example, many of the processes discussed above can be implemented through different methods, replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A probing device comprising:
   a chuck configured to support a device under test (DUT); and
   a probe card disposed above the chuck;
   wherein the probe card includes an inlet configured to convey a gas into the probe card, and an outlet configured to blow the gas from the probe card toward the chuck,
   wherein the outlet includes a plurality of sub-outlets, and orientations of the sub-outlets are adjustable.

2. The probing device of claim 1, wherein the probe card further includes a temperature-controlling device configured to adjust temperature of the gas blown out from the outlet.

3. The probing device of claim 1, wherein the predetermined temperature is in a range between about −60° C. and about 300° C.

4. The probing device of claim 1, wherein a distance between the outlet and the DUT is substantially less than or equal to 10 mm.

5. The probing device of claim 1, wherein the gas is clean dry air or a nitrogen gas.

6. The probing device of claim 1, wherein the outlet is oriented toward a center of the DUT.

7. The probing device of claim 1, further comprising a controller electrically connected to the probe card, wherein the controller is configured to determinate whether the temperature measured by the probe card conforms to the predetermined temperature.

8. The probing device of claim 1, further comprising a chamber, wherein the chuck, the DUT and the probe card are arranged in the chamber.

9. The probing device of claim 1, wherein the DUT is a semiconductor device.

10. The probing device of claim 1, wherein the DUT is a wafer.

11. A method, comprising:
    providing a chuck, a device under test (DUT) disposed on the chuck, and a probe card disposed above the DUT, wherein the probe card includes an inlet and an outlet connected to the inlet; and
    blowing a gas into the inlet of the probe card, and the outlet configured to blow the gas from the probe card toward the DUT,
    wherein the outlet includes a plurality of sub-outlets, and orientations of the sub-outlets are adjustable.

12. The method of claim 11, further comprising adjusting a temperature of the gas in the probe card to the predetermined temperature.

13. The method of claim 11, further comprising conveying the gas into the probe card.

14. The method of claim 11, further comprising altering a temperature of at least a portion of the DUT during or after the blowing of the gas.

15. The method of claim 11, wherein unwanted material is removed from the DUT or from the probe card by the blowing of the gas.

16. The method of claim 11, wherein the predetermined temperature is in a range between about −60° C. and about 300° C.

17. The method of claim 11, wherein the predetermined temperature is a room temperature.

18. The method of claim 11, wherein the gas is blown at a predetermined speed.

19. The method of claim 11, wherein the gas is blown toward the center of the DUT.

* * * * *